United States Patent
Hallé et al.

(10) Patent No.: US 7,636,642 B2
(45) Date of Patent: Dec. 22, 2009

(54) DIRECT JITTER ANALYSIS OF BINARY SAMPLED DATA

(75) Inventors: Francine Hallé, Somerville, MA (US); Leonard G Monk, Dunstable, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 10/465,010

(22) Filed: Jun. 19, 2003

(65) Prior Publication Data

US 2004/0260492 A1    Dec. 23, 2004

(51) Int. Cl.
*G01R 31/00* (2006.01)
*G01R 31/14* (2006.01)

(52) U.S. Cl. ........................... 702/119; 702/117

(58) Field of Classification Search ............... 702/69, 702/79, 89, 106, 117, 119, 120, 123, 125, 702/187, 179; 375/226, 340, 342, 355, 360, 375/371, 375; 324/500, 527, 532, 537, 763, 324/765

See application file for complete search history.

(56) References Cited

U.S. PATENT DOCUMENTS

| 4,756,008 | A | * | 7/1988 | Yagi et al. ................ 375/281 |
| 5,566,215 | A | * | 10/1996 | Coquerel ................ 375/371 |
| 6,460,001 | B1 | * | 10/2002 | Yamaguchi et al. ........ 702/69 |
| 6,694,462 | B1 | * | 2/2004 | Reiss et al. ............... 714/724 |
| 7,143,323 | B2 | * | 11/2006 | Sweet ..................... 714/724 |
| 2004/0117692 | A1 | * | 6/2004 | Sweet ..................... 714/701 |
| 2004/0128591 | A1 | * | 7/2004 | Ihs et al. .................. 714/704 |

OTHER PUBLICATIONS

Wikipedia, "Root Mean Square", pp. 1-4, last modified Oct. 1, 2007.*

* cited by examiner

*Primary Examiner*—Michael P Nghiem
(74) *Attorney, Agent, or Firm*—K&L Gates LLP

(57) ABSTRACT

A technique for determining the timing location and/or jitter of a signal edge includes computing differences between pairs of adjacent samples of the signal edge to yield difference values. First and second statistical moments are computed directly from the difference values, and mean edge location and standard deviation are computed from the first and second moments.

5 Claims, 3 Drawing Sheets

DIRECT JITTER ANALYSIS OF BINARY SAMPLED DATA

CROSS-REFERENCES TO RELATED APPLICATIONS

Not Applicable.

STATEMENT REGARDING FEDERALLY SPONSORED RESEARCH OR DEVELOPMENT

Not Applicable.

Reference to Microfiche Appendix

Not Applicable

BACKGROUND OF THE INVENTION

1. Field of the Invention

This invention relates generally to automatic test equipment and processes, and more particularly to testing timing characteristics of high-speed devices.

2. Description of Related Art

Manufacturers of integrated circuits use automatic test equipment (ATE) to test devices during the manufacturing process. ATE allows manufacturers to diagnose defects early, and thus saves costs that would otherwise be spent processing defective parts. ATE also allows manufacturers to grade devices across different levels of performance. As better performing devices generally fetch higher prices, the ability to test integrated circuits translates into increased profits.

A primary goal of automatic test equipment (ATE) is to test electronic devices quickly and accurately. As electronic devices become faster, ATE must advance to keep pace with these improvements.

One recent area of rapid technological growth has been SerDes technology. As is known, SerDes devices convert parallel data streams into serial bit streams that change at a multiple of the input, parallel data rate. They also perform the reverse function of deserializing serial bit streams, by converting them into parallel data streams that change at a fraction of the serial data rates. SerDes devices are now available at serial bit rates up to 10 Gb/s (billion bits per second), and 40 Gb/s parts will soon be offered.

Specialized techniques have been developed to test SerDes devices. One such technique is disclosed in U.S. patent application Ser. No. 09/635,334, now U.S. Pat. No. 6,694,462, entitled "CAPTURING AND EVALUATING HIGH SPEED DATA STREAMS," which is hereby incorporated by reference.

FIG. 1 shows a simplified version of a test setup presented in that prior patent application. The test setup of FIG. 1 is suitable for testing a device under test 120 ("DUT"), such as a SerDes device. As shown, the test setup includes a component tester 110 having a host processor 112, a timing generator 114, a memory 116, detector circuits 118a, and driver circuits 118b. The host processor 112 stores a test program (not shown) for controlling the component tester 110. The timing generator 114 includes circuitry for producing timing signals at precise instants in time defined by the test program. The timing signals control the times at which input signals can be captured by detector circuits 118a, and the times at which output signals can be asserted by driver circuits 118b. The memory 116 stores the digital levels of signals sampled by the detector circuits 118a. It also stores the digital levels of signals to be outputted by the driver circuits 118b.

The test setup includes a sampling circuit 130, which may be part of the test system 110 or may be independent. The sampling circuit 130 is generally capable of sampling at much higher rates than the detector circuits 118a of the tester. The sampling circuit 130 preferably includes a comparator portion 132 and a latch portion 134. The latch portion 134 has an output that is coupled to a detector circuit 118a to allow the tester 110 to read back latched values from the output of the sampling circuit 130. A STROBE signal, provided by a driver circuit 118b, drives a Latch Enable (LE) input of the latch portion 134. When the STROBE signal activates the LE input, the sampling circuit 130 holds at its output whatever level is present at its input and maintains that level regardless of changes at its input. When the STROBE signal de-activates, the latch portion 134 becomes transparent.

By properly arranging the test program, the tester 110 can produce a CLOCK signal for activating the DUT to produce a known bit stream. The tester can also produce the STROBE signal for sampling this bit stream at precisely controllable instants of time. Because the DUT generally operates at higher speeds than the tester, direct, sequential sampling is generally not feasible, and the tester preferably undersamples the bit stream, i.e., it stimulates the DUT to repetitively output the same bit stream and samples the bit stream at different timing locations on successive iterations. Preferably, the sampling period is set to be a very small timing increment longer than the repetition period of the bit stream, so that the STROBE signal effectively "walks" through the bit stream with very high effective timing resolution.

FIG. 2 shows various aspects of an undersampling process employed by the above-incorporated prior patent application. The tester 110 stimulates the DUT to repetitively produce a known bit stream 210. The tester also produces the STROBE signal 212 for directing the sampling circuit to sample the bit stream 210. To capture different portions of the bit stream 210, the tester preferably advances the STROBE signal 212 through time on successive iterations. A sequence of STROBE signals 220 cause the sampling circuit and test system to undersample the bit stream at an effective sampling rate sufficiently high to capture a large number of samples at each signal edge.

The sampling circuit 130 is preferably a binary sampler. At each STROBE location (i.e., for each sample), the sampling circuit outputs a logic '1' or a logic '0,' in response to the logical state of the bit stream being either a '1' or '0,' respectively, at the instant of sampling.

FIG. 2 shows an exploded region 214 of the bit stream, which includes an edge 216. It is evident that the edge does not occur at a precisely fixed point in time, but rather varies slightly upon different iterations of the bit stream due to timing jitter.

Because the bit stream is subject to jitter, samples taken at the same timing location of an edge transition do not yield repeatable results. Sometimes, for example, a rising edge ('0'to '1') will occur slightly later than normal, causing the sampling circuit to output a '0.' Other times, the rising edge will occur slightly earlier than normal, causing the sampling circuit to output a '1.' It should be noted that for differential signals a signal is a '1' if the high side of the differential signal is more positive than the low side. For single-ended signals, a signal is '1' if it exceeds a threshold level.

If the same timing location is sampled a large number of times, the statistical average of the samples corresponds to the probability that the bit stream is a 1 at that timing location. By repetitively sampling the bit stream at each timing location and averaging the corresponding samples, a probability curve 222 is produced that describes the probability that the bit stream is a 1 as a function of time.

As shown in FIG. 2, the probability curve 222 has a low region 224, wherein repeated samples consistently read '0.' It also has a high region 228, wherein samples consistently read '1.' Between these high and low regions is a transition region 226, wherein the probability is between '0 and '1' that an edge occurs. Samples in this region are sometimes '0' and sometimes '1.' If jitter is Gaussian, the shape of the probability curve 222 is S-shaped in this transition region 226.

In statistical terminology, the probability curve 222 describes a Cumulative Distribution Function, or "CDF," of the edge position. Preferably, the effective sampling rate is high enough so that a large number of samples are located in the vicinity of the edge (only several such points are shown in FIG. 2 for ease of illustration). The CDF can thus be constructed with high resolution.

Once the CDF is known, other statistical properties can be estimated. In the prior art, statistical properties are obtained by subjecting the CDF to an Inverse Gaussian CDF transform (ERF function in C library). The resulting function is then least-squares fit to a straight line. The Y-intercept of the resulting line gives the mean of the distribution, i.e., mean edge position, and the slope of the line gives the standard deviation.

We have recognized some shortcomings with this prior technique. For instance, this technique requires a great deal of data. In order to construct a CDF accurately, multiple samples (e.g., 128) are taken at each timing location, and a great many timing locations are preferably used. Processing this large amount of data tends to be computationally intensive. We have also found that the very act of averaging masks certain useful information about jitter. Some components of jitter are attributable to short term effects, such as random noise, whereas other components are attributable to long term effects, such as temperature changes. Because averaging combines samples taken over a relatively long period of time (e.g., the time required to collect 128 samples of each point), it effectively mixes together these short term and long term effects, making it difficult to observe short term and long term effects separately. In addition, the prior technique assumes that the distribution of samples is Gaussian. It can therefore give inaccurate results for bi-modal or other types of distributions.

We have recognized that better accuracy for non-Gaussian distributions may be obtained by applying well-known statistical formulae to the CDF. This alternative technique is now described in reference to FIG. 3.

FIG. 3 shows a CDF 310 and a Probability Density Function, or "PDF" 312. As is known, the PDF 312 is the first derivative of the CDF 310. From the PDF, first and second moments M1 and M2 can be computed for any time interval, t1 to t2, where $$M1 = \int_{t1}^{t2} t^* PDF(t) dt \qquad (EQ. 1)$$

and $$M2 = \int_{t1}^{t2} t^{2*} PDF(t) dt. \qquad (EQ. 2)$$

The mean edge location $\mu$ equals the first moment M1 of the PDF, i.e., $\mu$=M1. The variance equals the difference between the second moment and the first moment squared, $M2-M1^2$. The standard deviation $\sigma$ in edge location is given by the square root of the variance, which expands into $$\sigma = \sqrt{\left(\int_{t1}^{t2} t^{2*} PDF(t) dt\right) - \mu^2}. \qquad (EQ. 3)$$

Therefore, given the CDF for any signal edge, the mean, variance, and standard deviation of the signal edge can be readily deduced, without regard for whether the distribution of samples is Gaussian.

Although this approach yields more accurate results for non-Gaussian distributions, it still requires a CDF, and thus requires a great deal of data. It also acquires samples over a long period of time and thus tends to mix together long-term and short-term components of jitter. What is desired is a less time-consuming technique for accurately measuring jitter.

BRIEF SUMMARY OF THE INVENTION

With the foregoing background in mind, it is an object of the invention to measure the timing locations and/or jitter of signal edges both accurately and quickly.

To achieve the foregoing object, as well as other objectives and advantages, a technique for determining the timing location and/or jitter of a signal edge includes computing differences between pairs of proximate-time samples of the signal edge to produce difference values. First and second statistical moments are taken of the difference values, from which mean and/or standard deviation of edge location are computed. Averaging of samples to produce a CDF is not required.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Figure 4:
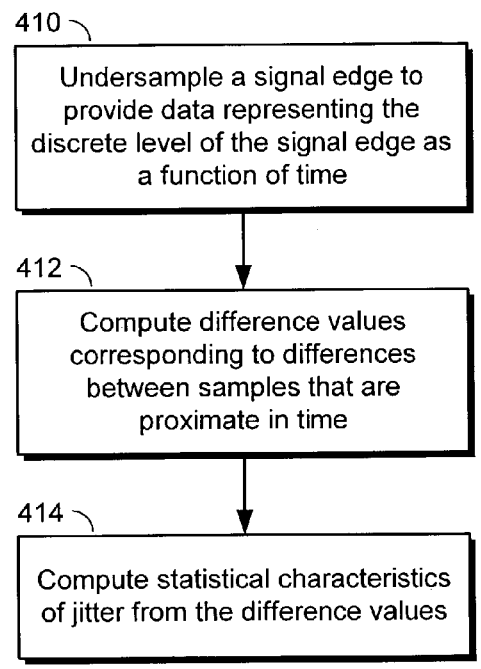
FIG. 4 shows a general process for computing statistical characteristics of a sampled signal edge according to the invention.

FIG. 4 shows a high level overview of an embodiment of the invention. At step 410, a signal edge is undersampled at regular intervals over a range of timing locations to determine whether the signal is a '1' or a '0' at each location.

Figure 7:
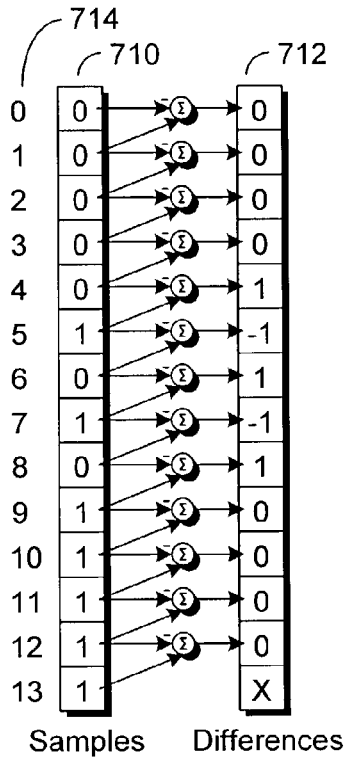
FIG. 7 is an illustration showing how the plurality of difference values may be computed from the samples according to the invention, when the samples are spaced at regular timing intervals.

At step 412, difference values are computed between samples that are proximate in time. The samples are ordered by timing location, and the difference values are preferably taken between each element and the previous element, i.e., a[i+1]−a[i], where "i" is an index that represents time between uniformly spaced samples. FIG. 7 shows the computation of difference values graphically—an array 712 of difference values is computed from differences between adjacent samples in an array 710, which is ordered by index 714.

At step 414, one or more statistical characteristics of the signal edge are computed directly from the difference values. These characteristics may include mean, variance, and standard deviation of the edge position (the specific method for computing these values is described below in connection with FIG. 8).

Differences between this technique and the prior art are readily apparent. For example, this technique does not require the averaging of individual samples. Statistical properties are computed directly from the difference values, without the need for deriving an actual CDF or PDF.

Figure 5:
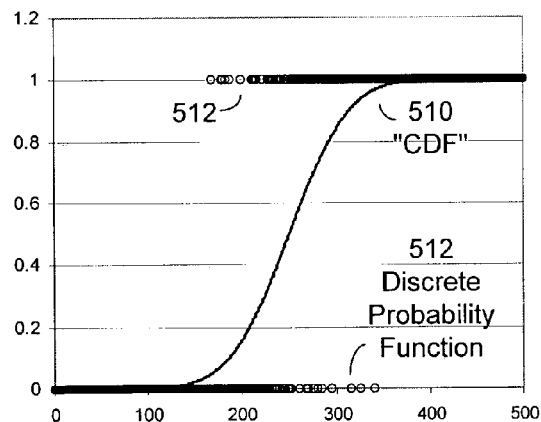
FIG. 5 is a graph showing the CDF of FIG. 3 and a collection of samples acquired in accordance with the invention.

FIG. 5 shows a graph of an actual CDF 510 for a typical signal edge having jitter. Discrete binary samples 512 of the same edge are shown on the same graph. For timing locations at which the signal being tested is always 0, the samples 512 and the CDF 510 are equal. For timing locations at which the signal is always '1,' the samples and the CDF 510 are also equal. However, in the region where the probability is between '0' and '1' that the edge occurs, the samples and the CDF differ. On the average, the samples and the CDF should be equal in this transition region. But individual samples are either '1' or '0,' whereas the CDF varies continuously between '1' and '0.'

Figure 3:
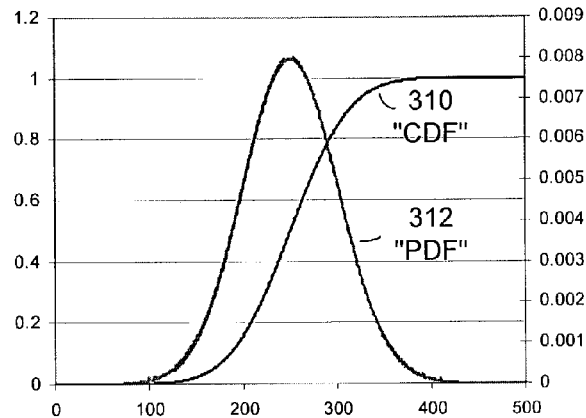
FIG. 3 is a graph showing a CDF of the location of a signal edge and a corresponding Probability Density Function ("PDF") derived from the CDF.
Figure 6:
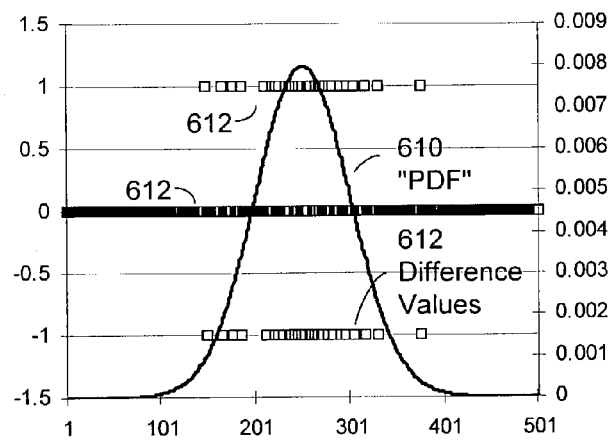
FIG. 6 is a graph showing the PDF of FIG. 3 and a plurality of difference values acquired from the samples of FIG. 5 in accordance with the invention.

FIG. 6 shows a PDF 610, which is the same as the PDF 312 of FIG. 3. On the same graph, FIG. 6 also shows difference values 612, which correspond to differences between adjacent samples 512. Because the samples 512 have only 2 possible values, '0' and '1,' the difference values have only 3 possible values, '0' (1−1 or 0−0), '1' (1−0), and '−1' (0−1).

Figure 8:
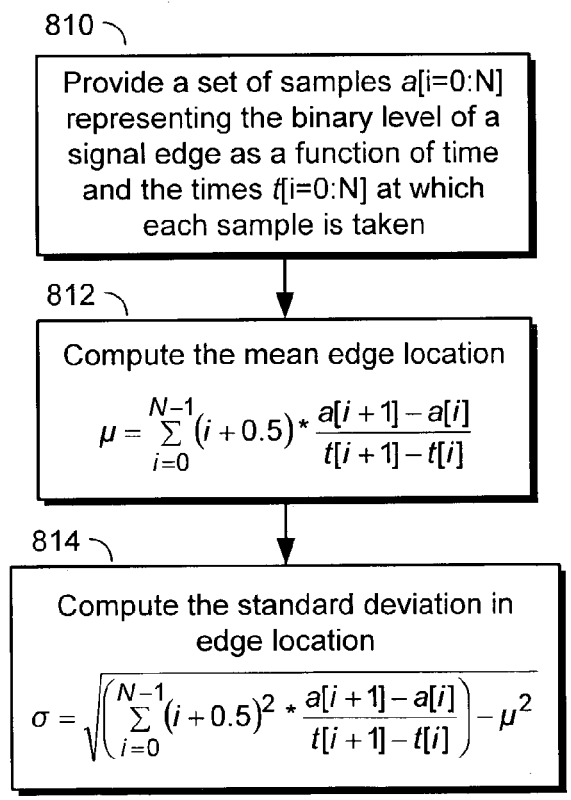
FIG. 8 shows a more specific process for computing statistical characteristics of a sampled signal edge according to the invention.

FIG. 8 describes a generalized approach according to the invention for computing statistical values directly from the difference values. This approach is applicable to both uniform sampling (evenly spaced) and non-uniform sampling (unevenly spaced).

At step 810, a time-ordered sequence of samples a[i=0: N] is provided. If the samples are acquired at a uniform sampling period, only the value of the samples (a[i]), the sampling period, and the order of the samples (i.e., index i) need be known. If the samples are acquired at a non-uniform sampling period, the time t[i] at which each sample is acquired is also needed.

At step 812, a mean value of edge position is computed in discrete form as the first moment of the difference values D[i]:

$$\mu = \sum_{i=0}^{N} (i+0.5)^* D[i] \quad \text{(EQ. 4)}$$

where $$D[i] = \frac{a[i+1] - a[i]}{t[i+1] - t[i]}. \quad \text{(EQ. 5)}$$

EQ. 4 is similar in form to EQ. 1 above. But it differs significantly from EQ. 1 in that the difference function D[i] is used in place of the PDF. The standard deviation in edge position can be computed from the second moment and the mean, as follows:

$$\sigma = \sqrt{\left(\sum_{i=0}^{N-1} (i+0.5)^{2*} D[i]\right) - \mu^2}. \quad \text{(EQ. 6)}$$

EQ. 6 is similar in form to EQ. 3 above. Again, a significant difference is that the PDF is not required. In both cases, the difference values are used directly in computing the respective statistical values.

Values for μ and σ can be computed using an efficient, single-pass algorithm. Each sample need only be accessed once in computing the desired results.

The difference values, D[i], correspond to the discrete derivative of a[i], regardless of whether sampling is uniform or non-uniform. However, for uniform sampling, D[i] can be expressed simply as (a[i+1]−a[i])/T, where "T" is the sampling period. To further simplify computations, T may be assumed to be 1. The results for μ and σ can each be divided by T following the computations of EQS. 4 and 6 to express μ and σ in proper units of time.

The quantity (i+0.5), instead of i alone, is used to multiply D[i] in EQS. 4 and 6 to reduce errors that arise from discrete sampling. The expression (i+0.5) represents the average index for a particular sample (i.e., halfway between i and i+1). We have found that the use of (i+0.5) instead of i effectively "centers" each sample with respect to its time position and reduces errors in computing μ and σ from ±1 sampling period to ±½ sampling period.

The above-described technique allows μ and σ to be computed accurately without the need for an actual CDF or PDF. Averaging of samples is not required. Because μ and a can be computed with less data, and therefore in less time, short-term jitter can be readily observed separately from long-term jitter. Data for computing the short term μ and σ can be repeatedly taken, and different short-term values of μ and σ can be compared to observe long-term changes.

Figure 1:
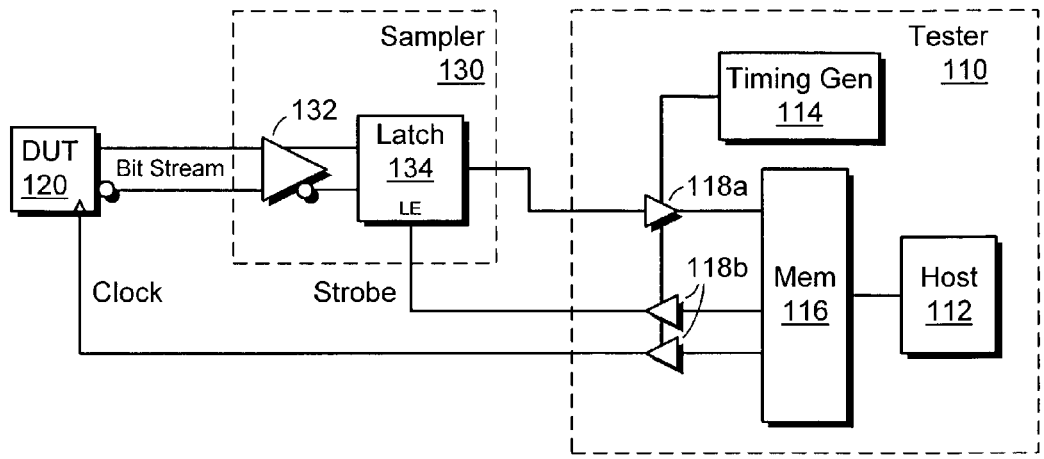
FIG. 1 is a simplified schematic of an automatic test system equipped with a high-speed sampler, which together are suitable for testing jitter in high speed signal edges according to both the prior art and the invention.

The process described herein is preferably conducted using a test arrangement similar to that pictured in FIG. 1. A tester is preferably used in connection with a sampling circuit (either internal or external) to characterize jitter. It can also be used to test devices in a manufacturing environment. In a typical test scenario, the standard deviation of an edge σ, which directly relates to its jitter, can be measured and compared with expected values. A device can be made to pass its test process if the jitter is within expected limits. Otherwise, the device can be made to fail. The device can also be graded along different levels of performance, depending upon the amount of jitter measured.

In the preferred embodiment, the algorithm for computing μ and σ is encoded as software in a computer program. The computer program can be a software module accessible to a test program. Alternatively, the program can be part of the test program itself or a stand-alone module. For even higher speed, the algorithm can be implemented in hardware using a custom circuit, such as an FPGA (Field-Programmable Gate Array) or an ASIC (Application Specific Integrated Circuit).

Alternatives

Having described one embodiment, numerous alternative embodiments or variations can be made. For example, the instant invention is described in connection with undersampling. However, it is not material to the invention how the samples are provided. For example, they may be provided in a data file or array, having previously been acquired. They may be fed to a processor as they are being acquired in a real-time sampling and processing arrangement.

Figure 2:
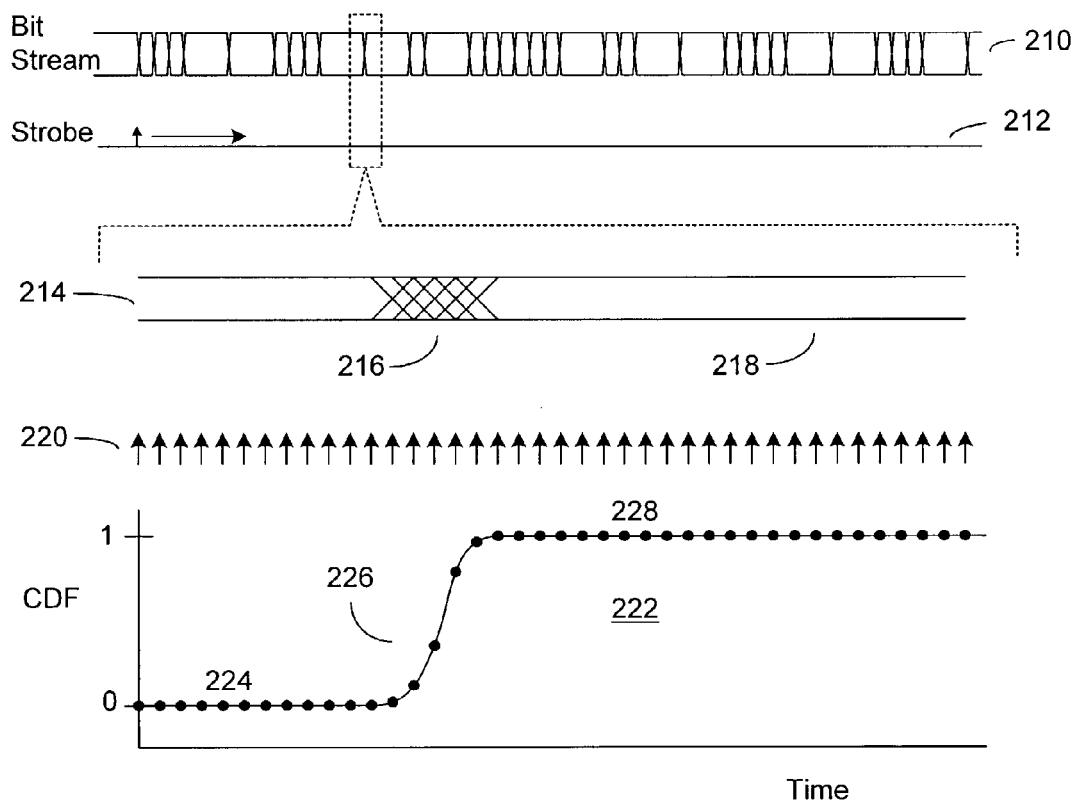
FIG. 2 is a series of timing diagrams showing a serial bit stream being sampled by the system of FIG. 1 to approximate a cumulative distribution function, or "CDF," of a signal edge of the serial bit stream, in a manner consistent with the prior art.

FIGS. 1 and 2 presume that the input signal is differential. This is not required, however. The instant invention can be applied equally well to differential and single-ended signals. For single-ended signals, a single-ended comparator may be used in which the input signal is compared with a threshold to determine whether it is greater than or less than the threshold at each instant of sampling. The threshold may be set to the expected 50% point of the input signal's swing, to a different point, or may be varied to ascertain additional characteristics of the input signal.

In addition, although the algorithm is described in connection with binary sampling, there is no requirement that the sampling circuit itself be binary. For instance, a multi-bit analog-to-digital converter (ADC) may be used to sample signals at greater than one bit of resolution. The values produced by the ADC can be converted to binary form by assigning all codes greater than or equal to a certain threshold a value of '1' and assigning all codes less than the threshold a value of '0.'

As described herein, each sample is an instantaneous, binary sample, having a state of '1' or '0.' However, nothing in the foregoing prevents averages of multiple samples taken at the same timing locations from being used in place of instantaneous samples in computing the difference values. Therefore, although averaging is not required according to the invention, averaging is not excluded, either.

The algorithm can also be varied in certain ways within the scope of the invention. For instance, the difference values D[i] can be computed as differences between each sample and the respective next sample, rather than the previous sample. Also, every sample need not be considered in producing the difference values. Every $2^{nd}$ (or more generally, $N^{th}$) time-ordered sample can be used to compute the difference values instead of every sample. This may be useful where best precision is not critical and rapid results are desired. In addition, each sample used to generate a difference value can represent an average of a group of neighboring samples taken at different instances in time.

Although it is necessary to know where in time each sample occurs relative to the other samples, samples may be acquired in any convenient order, and ordered by time when processed based on where they occur along the input signal.

The invention involves mathematical computations. As is known, mathematical expressions can be transformed into a wide range of different equivalent forms. The invention is intended to cover these different forms that represent essentially the same things as the expressions disclosed.

Therefore, while the invention has been particularly shown and described with reference to the preferred embodiments thereof, it will be understood by those skilled in the art that various changes in form and detail may be made therein without departing from the spirit and scope of the invention.

What is claimed is:

1. An automatic test system for testing a device under test (DUT), comprising:
    a timing generator for generating a timing signal that clocks the DUT to produce an output signal and the timing generator for generating a timing signal for activating a sampling strobe; and
    a sampling circuit having an input connectable to the DUT for receiving a signal edge of the timing signal and an output arranged to provide a time-ordered plurality of substantially non-averaged samples of the signal edge at instants of time when the sampling strobe is activated;
    a processor for computing differences between time-ordered plurality of samples that are proximate in time and for processing the computed differences to determine at least one of a mean, a variance, and a standard deviation in a timing location of the signal edge.

2. An automatic test system as recited in claim 1, further comprising a memory for storing the time-ordered plurality of substantially non-averaged samples.

3. An automatic test system as recited in claim 1, wherein the sampling circuit comprises a comparator that generates a 1-bit output.

4. A method of testing edge location and/or jitter on a single signal edge produced by a device under test (DUT), comprising:
    accessing a time-ordered plurality of samples indicative of levels of the signal edge at different points in time, wherein at least one of the time-ordered plurality of samples is a non-averaged 1-bit sample;
    generating a time-ordered plurality of difference values, each difference value corresponding to a difference between a pair of time-adjacent samples of the time-ordered plurality of samples; and
    computing, using a processor, a standard deviation of a timing location of the signal edge from the time-ordered plurality of difference values, wherein the standard deviation is responsive to a second moment of the time-ordered plurality of difference values, the standard deviation indicating a result of the testing;
    wherein the step of generating the time-ordered plurality of difference values comprises, for each sample, computing an arithmetic difference between the respective sample and an adjacent sample and dividing the arithmetic difference by an effective sampling period.

5. A method of manufacturing an integrated circuit, comprising:
    applying the integrated circuit to an automatic test system;
    exercising a test program with the automatic test system for testing the integrated circuit; and
    determining whether the integrated circuit passes or fails the test program, wherein the test program performs the steps of
    directing the tester to undersample a signal edge from the integrated circuit to produce a time-ordered plurality of samples, wherein at least one of the time-ordered plurality of samples is a non-averaged 1-bit sample;
    computing differences between ones of the plurality of samples that are proximate in time; and
    processing the computed differences to determine a standard deviation of a single signal edge, wherein the standard deviation is responsive to a second moment of the differences between the plurality of samples that are proximate in time, the standard deviation of the signal edge indicating a result of the test program;
    wherein the step of computing differences comprises, for each sample, computing an arithmetic difference between a respective sample and an adjacent sample and dividing the arithmetic difference by an effective sampling period.

* * * * *